United States Patent [19]

Matui et al.

[11] 4,435,653
[45] Mar. 6, 1984

[54] IN-PHASE VOLTAGE ELIMINATION CIRCUIT FOR HALL ELEMENT

[75] Inventors: Kunihiko Matui, Komukainishi; Shikei Tanaka, Chigasaki, both of Japan

[73] Assignee: Tokyo Shibaura Denki Kabushiki Kaisha, Kanagawa, Japan

[21] Appl. No.: 318,852

[22] Filed: Nov. 6, 1981

[30] Foreign Application Priority Data

Nov. 26, 1980 [JP] Japan ............................. 55-166409
Apr. 15, 1981 [JP] Japan ............................. 56-56714

[51] Int. Cl.³ ........................ H03K 17/60; H03K 7/10
[52] U.S. Cl. ................................. 307/309; 307/491; 324/117 H
[58] Field of Search ................ 307/309, 511, 491; 330/6; 324/117 H; 323/368, 294

[56] References Cited

U.S. PATENT DOCUMENTS 3,290,616 12/1966 Guyot et al. ........................ 307/309
3,921,069 11/1975 Milkovic ............................ 317/117 H
4,020,294 4/1977 Kitajewski et al. ............. 324/117 H
4,199,696 4/1980 Tanaka et al. ..................... 307/309
4,200,814 4/1980 Tanaka et al. ..................... 307/309

FOREIGN PATENT DOCUMENTS 53-26550 3/1978 Japan ..................................... 330/6

Primary Examiner—Stanley D. Miller
Assistant Examiner—B. P. Davis
Attorney, Agent, or Firm—Cushman, Darby & Cushman

[57] ABSTRACT

An in-phase voltage elimination circuit in which a Hall element has first and second control current input terminals and first and second output terminals, the first and second control current input terminals fed with a control current and the first output terminal connected to one input terminal of an operational amplifier. The other output of the operational amplifier is connected to ground, and the output terminal of the operational amplifier is connected to one of the first and second control current input terminals. A Hall output is produced at the second output terminal of the Hall element.

11 Claims, 5 Drawing Figures

F I G. 5
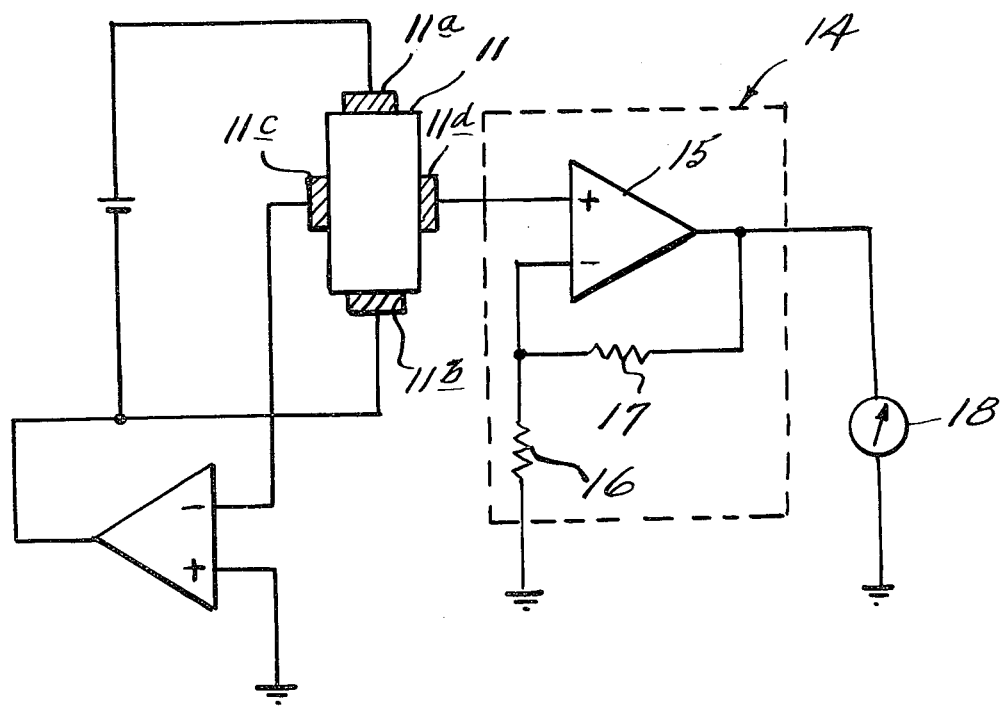

IN-PHASE VOLTAGE ELIMINATION CIRCUIT FOR HALL ELEMENT

BACKGROUND OF THE INVENTION

This invention relates to a circuit for eliminating in-phase voltage of a Hall element.

Hall elements, which are used for magnetic sensors such as Gauss meters and the like, convert magnetic variation into electrical signal variation. As well known, the Hall element includes a semiconductor plate such as GaAs, InSb, InAs, Ge or Si, having a pair of control current input terminals for supplying a control current to the semiconductor plate and a pair of output terminals. When a magentic field is applied to the Hall element in a direction perpendicular to the control current direction while the control signal is supplied to the Hall element, an output signal voltage (a Hall output voltage) corresponding to the magnitude of the magnetic field is produced at the output terminals.

This output signal, however, includes a certain D.C. voltage besides the Hall output voltage. This D.C. voltage is called "in-phase voltage" and is produced on account of a voltage drop between the control current input terminal and the output terminals of the Hall element. A Hall element can be conceptualized as a network of four resistive elements having a common connection. When the connection is at a voltage other than ground, the in-phase voltage results. Accordingly, the in-phase voltage is generated independent of the application of the magnetic field.

Generally, this in-phase voltage is much larger than the Hall output voltage. For example, a GaAs Hall element having an integrating sensitivity of 20 mV/Ma.KG and an internal resistance 1 k$\Omega$ produces a Hall output voltage of 20 mV, when a control current 1 mA and a magnetic flux density having a magnetic flux density 1 KG are applied to the Hall element. However, the Hall element also produces an in-phase voltage of 500 mV. The Hall output voltage biased by the in-phase voltage cannot be amplified sufficiently by an amplifier because the amplification ability of the amplifier cannot be utilized efficiently for amplifying the Hall output voltage. Accordingly, the in-phase voltage should be eliminated.

One known method for eliminating the in-phase voltage of the Hall element is by employing a differential amplifier for canceling the in-phase voltages produced at the pair of output terminals as described in U.S. Pat. Nos. 4,199,696 and 4,200,814.

This differential amplifier, however, should have a high common-mode rejection ratio (CMRR) in order to cancel the in-phase voltages accurately. To obtain a high CMRR the ratio of resistances used in the differential amplifier should be adjusted accurately by employing highly accurate resistances or variable resistances. Accordingly, such an in-phase voltage eliminating circuit using a differential amplifier has a complicated structure and costs too much.

SUMMARY OF THE INVENTION

It is one object of this invention to provide a relatively simple, low cost in-phase voltage eliminating circuit for a Hall element.

It is another object of this invention to provide an in-phase voltage eliminating circuit which can eliminate the in-phase voltage of the Hall element with high accuracy.

In accordance with the preferred embodiment of this invention, the in-phase voltage elimination circuit includes a Hall element having first and second control current input terminals and first and second output terminals, and an operational amplifier. The operational amplifier has a first input terminal connected to reference potential such as ground potential, a second input terminal connected to the first output terminal of the Hall element, and an output terminal connected to one of the first and second control current input terminals. Between the first and second control current input terminals a control current is supplied by a power source and a Hall output voltage is produced at the second output terminal of the Hall element. When the first input terminal of the operational amplifier is at the ground potential, the second input terminal of the operational amplifier is also at the ground potential. This ensures that the imaginary connection point of the resistors also is at ground. Therefore, no in-phase voltage is produced at the second output terminal of the Hall element.

BRIEF DESCRIPTION OF THE DRAWINGS

Other objects and advantages of this invention will become more apparent and more readily appreciated from the following detailed description of the presently preferred exemplary embodiments of the invention taken in conjunction with the accompanying drawings, in which:

FIG. 5 is a circuit diagram of a Gauss meter using a Hall element with an embodiment of a constant voltage source type in-phase voltage elimination circuit according to the present invention.

DESCRIPTION OF THE PREFERRED EMBODIMENTS

Figure 1:
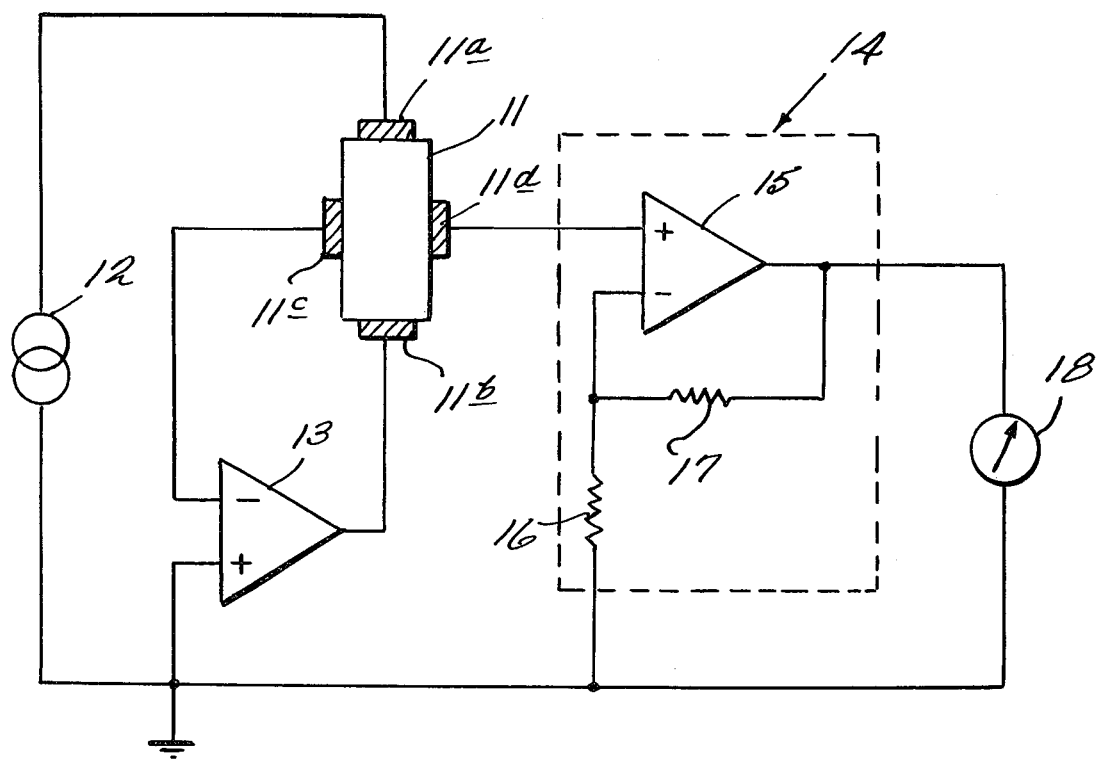
FIG. 1 is a circuit diagram of a Gauss meter using a Hall element with an embodiment of a constant current source type in-phase voltage elimination circuit according to the present invention.

Referring to FIG. 1, a Hall element 11, for example, a GaAs Hall element has first and second control current input terminals 11a and 11b, and first and second output terminals 11c and 11d. First control current input terminal 11a of Hall element 11 is connected to a constant current source 12. Second control current input terminal 11b of Hall element 11 is connected to an output terminal of an operational amplifier 13. Operational amplifier 13, which is high gain direct-current amplifier, has inverted and non-inverted input terminals. The non-inverted input terminal of operational amplifier 13 is connected to ground. The inverted input terminal of operational amplifier 13 is connected to first output terminal 11c of Hall element 11.

Second output terminal 11d is connected to a non-inversion amplifier 14. Non-inversion amplifier 14 includes an operational amplifier 15 which has a non-inverted input terminal connected to second output terminal 11d of Hall element 11 and an inverted input terminal connected to ground through a resistance 16. An output of operational amplifier 15 is fed back to the inverted input terminal thereof through a resistance 17 and also delivered to a voltage meter 18.

In operation, a control current is supplied to Hall element 11 through first control current input terminal 11a from constant current source 12. Thus supplied control current passes through Hall element 11 and then emerges from second control current input terminal 11b. This control current is drawn in operational amplifier 13.

As is well known, when the non-inverted input terminal of operational amplifier 13 is at the ground potential, the inverted input terminal of operational amplifier 13 is also at the ground level. Accordingly, first output terminal 11c of Hall element 11 is also at the ground level. As a result, the Hall output voltage from which the in-phase voltage has been eliminated is produced at second output terminal 11d. The thus obtained Hall output voltage is amplified by non-inversion amplifier 14 and then delivered to voltage meter 18.

As described above, in accordance with the embodiments of the present invention, first output terminal 11c of Hall element 11 is at the ground potential. Accordingly, the in-phase voltage of Hall element 11 is eliminated automatically and accurately without using a differential amplifier. The first input terminal of operational amplifier 13 is preferably at the ground potential. However, the same result is achieved when the first input terminal is at some low reference potential other than ground.

As a result, the in-phase elimination circuit and magnetic sensors using Hall elements with this in-phase elimination circuit have simple structures and low cost because it is not necessary to use variable resistors and highly accurate resistors. Also, amplifier 14 connected to Hall element 11 is designed easily. Since first output terminal 11c of Hall element 11 is at the ground potential, the Hall output voltage varies about ground potential. Accordingly, the Hall output signal may have larger amplitude. For example, if a signal processing circuit connected to the output terminal of the Hall element has a power source voltage V, the Hall output signal may have also approximately $+/-$ V of amplitude. This advantage is particularly useful when the circuit is operated by low power voltage.

For the same reason, the in-phase voltage elimination circuit according to the present invention may feed the control current to the Hall element twice as much as the prior art, when the control current is A.C. current. That is, the Hall element with the in-phase voltage elimination circuit of this invention has sensitivity twice as much as the prior art.

Figure 2:
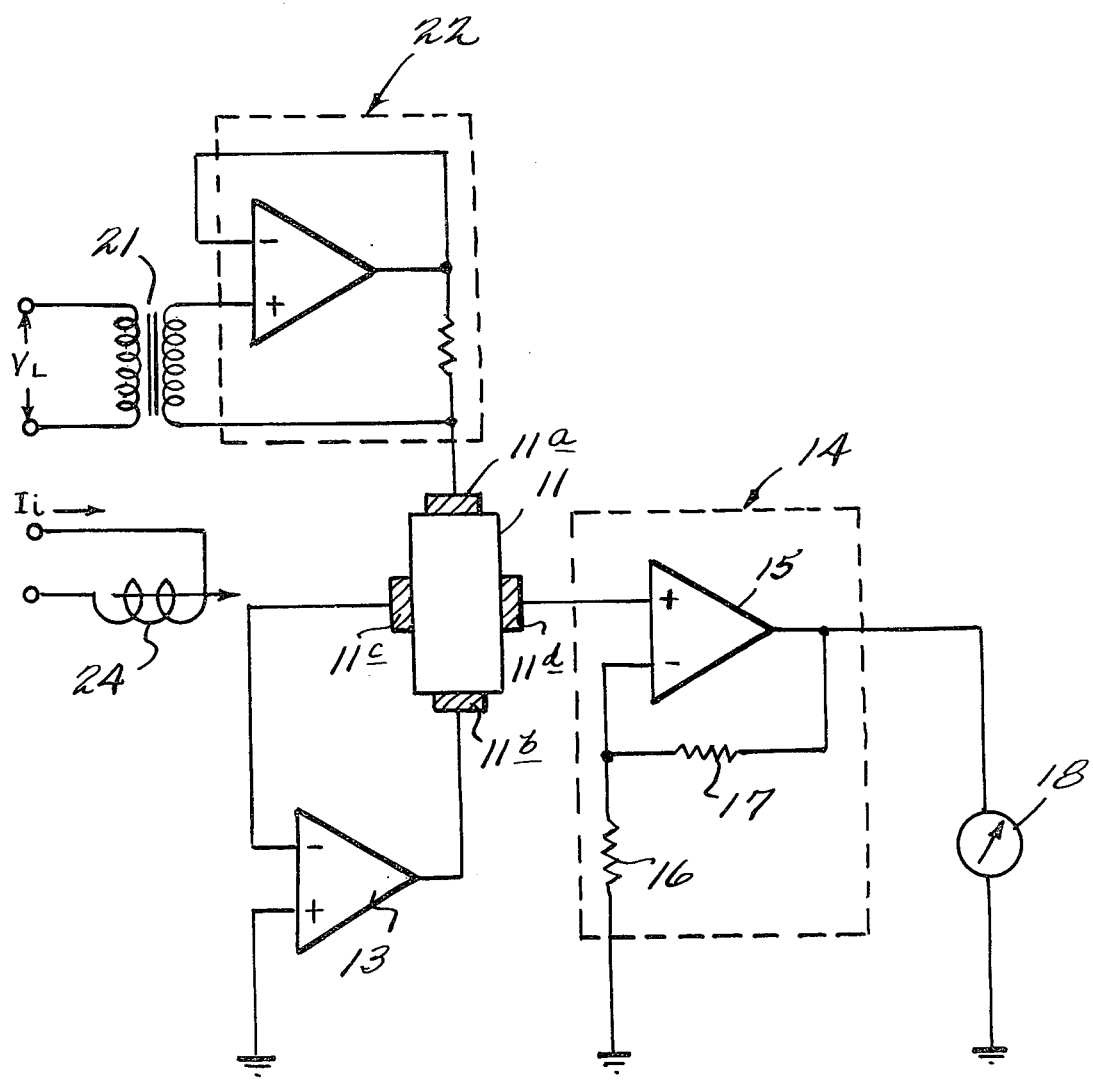
FIG. 2 is a circuit diagram of an A.C. watt hour meter using a Hall element with the in-phase voltage elimination circuit shown in FIG. 1.

FIG. 2 illustrates an A.C. watt hour meter circuit using a Hall element with the in-phase voltage elimination circuit shown in FIG. 1. In FIG. 2, like reference characters designate similar parts to that of FIG. 1. A.C. voltage $V_L$ is delivered to a current source circuit 22 through a transformer 21. Current source circuit 22 converts the A.C. voltage $V_L$ to a current proportional to the magnitude of the A.C. voltage $V_L$ and then supplies it as a control current to first control current terminal 11a of Hall element 11. A load current $I_L$ is converted to a magnetic field B proportional to the magnitude of the control current $I_L$ by a coil 24. As a result, Hall element 11 produces at second output terminal 11d the product of the intensity of the magnetic field and the magnitude of the control current, i.e., the Hall output voltage of the consumed power which is the product of the load current $I_L$ and the A.C. voltage $V_L$.

Figure 3:
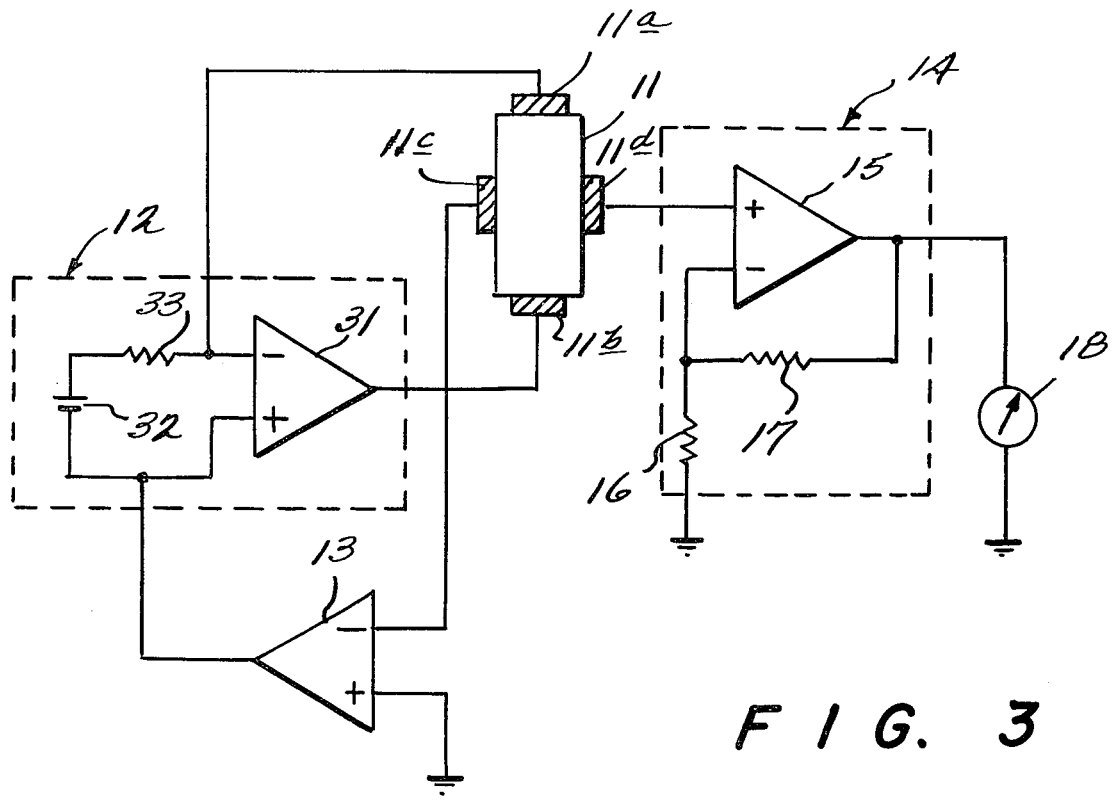
FIG. 3 is a circuit diagram of a Gauss meter using a Hall element with another embodiment of the constant current source type in-phase voltage elimination circuit according to the present invention.

FIG. 3 shows another embodiment of the constant current source type in-phase voltage elimination circuit according to the present invention. This embodiment is similar to that illustrated in FIG. 1 except that current source 12 is connected between control current input terminals 11a and 11b, and the output of operational amplifier 13 is connected to current source 12.

Current source 12 includes an operational amplifier 31, an inverted input terminal of which is connected to the first control current input terminal 11a and also connected to a positive pole of a D.C. power source 32 through a resistance 33. A non-inverted input terminal of operational amplifier 31 is connected to a negative pole of D.C. power source 32 and also connected to the output terminal of operational amplifier 13.

The control current from constant current source 12 passes through Hall element 11 and then flows into operational amplifier 31 of constant current source 12. Since the non-inverted input terminal of operational amplifier 13 is at ground potential, the inverted input terminal of operational amplifier 13 and first output terminal 11c of Hall element 11 are also at the ground potential. Accordingly, the in-phase voltage is eliminated like in the circuit shown in FIG. 1. In this circuit, operational amplifier 13 does not overheat because the control current does not flow into operational amplifier 13.

Figure 4:
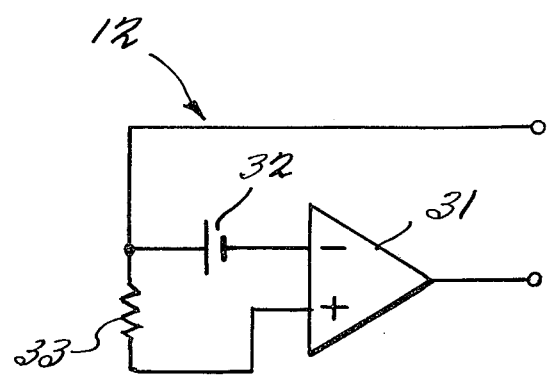
FIG. 4 is a circuit diagram of another type constant current source.

As an alternative to constant current source 12 shown in FIG. 3 a constant current source 12 shown in FIG. 4 may be employed. Referring to FIG. 4, this constant current source 12 includes an operational amplifier 31. An inverted input terminal of operational amplifier 31 is connected to control current input terminal 11a of Hall element 11 through a D.C. power source 32 and also connected to a non-inverted input terminal of operational amplifier 31 through a resistance 33. The output terminal of operational amplifier 31 is connected to second control current input terminal 11b of Hall element 11.

FIG. 5 illustrates a Gauss meter circuit with a constant voltage source type in-phase voltage elimination circuit according to the present invention. In FIG. 5, like reference characters designate similar parts to that of FIG. 1. A Hall element 11 has first and second control current input terminals 11a and 11b, and first and second output terminals 11c and 11d. Between first and second control current input terminals 11a and 11b of Hall element 11 a constant voltage source 30 is connected. Second control current input terminal 11b of Hall element 11 is also connected to an output terminal of an operational amplifier 13. Operational amplifier 13 has a non-inverted input terminal connected to ground and an inverted terminal connected to first output terminal 11c of Hall element 11.

The control current is fed from constant voltage source 30 to Hall element 11. The non-inverted input terminal of operational amplifier 13 is connected to ground. Accordingly, the inverted input terminal of operational amplifier, i.e., second output terminal 11c of Hall element 11 is at ground level. As a result, the in-phase voltage of Hall element 11 is automatically eliminated.

In general, magnetoelectric converters such as magnetic sensors or the like using Hall element employ a constant current source more frequently than a constant voltage source because the internal resistance of the Hall element is changed by variations of the temperature and the intensity of the magnetic field. Accordingly, the constant current source type is used for magnetoelectric converters requiring high accuracy. However, in a magnetoelectric converter which does not require high accuracy, the constant voltage source type as shown in FIG. 5 is useful.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. An in-phase voltage elimination circuit comprising:
   a Hall element having first and second control current input terminals and first and second output terminals, said second control current input terminal being connected to neither of said first and second output terminals;
   means for supplying a control current to said first control current input terminal of said Hall element; and
   an operational amplifier having a first input terminal connected to reference potential, a second input terminal connected to said first input terminal of said Hall element, and an output terminal connected to second control current input terminal of said Hall element; wherein said Hall element produces a Hall output at said second output terminal of said Hall element.

2. An in-phase voltage elimination circuit according to claim 1, wherein said first input terminal of said operational amplifier is connected to ground.

3. An in-phase voltage elimination circuit according to claim 1, wherein said control current supplying means is a constant current source.

4. An in-phase voltage elimination circuit according to claim 1, wherein said control current supplying means is a constant voltage power source connected between said first and second control current input terminals.

5. An in-phase voltage elimination circuit according to claim 1, wherein said control current supplying means comprises a converter for converting load voltage into constant control current and then for feeding the constant control current to said Hall element.

6. An in-phase voltage elimination circuit comprising:
   a Hall element having a pair of control current input terminals and a pair of output terminals, said control current input terminals being disconnected from said output terminals;
   a power source for feeding a control current between said pair of control current input terminals of said Hall element; and
   an operational amplifier having a first input terminal connected to reference potential, a second input terminal connected to one of said output terminals of said Hall element to produce a Hall output voltage at the other output terminal of said Hall element, and an output terminal connected to said power source.

7. An in-phase voltage elimination circuit according to claim 6, wherein said power source is a constant current source.

8. An in-phase voltage elimination circuit according to claim 7, wherein said constant current source comprises:
   an operational amplifier having an inverted input terminal connected to one of control current input terminals of said Hall element, an output terminal connected to the other control current input terminal of said Hall element; and
   a constant voltage power source, one terminal of which is connected to said inverted input terminal of said operational amplifier through a resistance, and the other terminal of which is connected to a non-inverted input terminal of said operational amplifier.

9. An in-phase voltage elimination circuit according to claim 7, wherein said constant current source comprises:
   an operational amplifier, an output terminal of which is connected to one of control current input terminal of said Hall element; and
   a constant voltage power source, one terminal of which is connected to one of input terminals of said operational amplifier, and the other terminal of which is connected to the other control current input terminal of said Hall element and also connected to the other input terminal of said operational amplifier through a resistance.

10. An in-phase voltage elimination circuit according to claim 6, wherein said power source is a constant voltage source connected between said pair of control current input terminals.

11. An in-phase voltage elimination circuit according to claim 6, wherein said first input terminal of said operational amplifier is connected to ground.

* * * * *